United States Patent
Ahn et al.

(10) Patent No.: US 9,837,465 B2
(45) Date of Patent: Dec. 5, 2017

(54) METHOD OF MANUFACTURING IMAGE SENSOR FOR REDUCING CROSSTALK CHARACTERISTIC

(71) Applicant: SAMSUNG ELECTRONICS CO., LTD., Suwon-si, Gyeonggi-do (KR)

(72) Inventors: Jung-Chak Ahn, Yongin-si (KR); Bum-Suk Kim, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/453,410

(22) Filed: Mar. 8, 2017

(65) Prior Publication Data

US 2017/0179190 A1    Jun. 22, 2017

Related U.S. Application Data

(63) Continuation of application No. 14/814,829, filed on Jul. 31, 2015, now Pat. No. 9,595,556.

(30) Foreign Application Priority Data

Aug. 1, 2014  (KR) ........................ 10-2014-0099137

(51) Int. Cl.
*H01L 21/77* (2017.01)
*H01L 27/146* (2006.01)

(52) U.S. Cl.
CPC .... *H01L 27/14685* (2013.01); *H01L 27/1463* (2013.01); *H01L 27/14621* (2013.01); *H01L 27/14627* (2013.01); *H01L 27/14629* (2013.01); *H01L 27/14641* (2013.01); *H01L 27/14645* (2013.01); *H01L 27/14687* (2013.01)

(58) Field of Classification Search
CPC ...................... H01L 27/14621; H01L 27/1463
See application file for complete search history.

(56) References Cited

U.S. PATENT DOCUMENTS

| | | | |
|---|---|---|---|
| 7,242,070 B2 | 7/2007 | Yang et al. | |
| 8,071,455 B2 | 12/2011 | Cole et al. | |
| 8,390,089 B2 | 3/2013 | Chen et al. | |
| 2006/0180885 A1 | 8/2006 | Rhodes | |
| 2013/0221410 A1* | 8/2013 | Ahn | ........... H01L 31/0232 257/225 |
| 2013/0320407 A1 | 12/2013 | Ahn | |

* cited by examiner

*Primary Examiner* — Daniel Shook
(74) *Attorney, Agent, or Firm* — Lee & Morse, P.C.

(57) ABSTRACT

An image sensor includes a plurality of photoelectric detectors, a plurality of color filters, and at least one pixel isolation region between adjacent ones of the photoelectric detectors. The color filters include a white color filter, and the color filters correspond to respective ones of the photoelectric detectors. The at least one pixel isolation region serves to physically and at least partially optically separate the photoelectric detectors from one another.

10 Claims, 11 Drawing Sheets

FIG. 2A

|   |   |   |   |   | 60 |   | 50 |
|---|---|---|---|---|---|---|---|
| G | B | G | W | G | B | G | W |
| W | W | W | R | W | W | W | R |
| G | W | G | B | G | W | G | B |
| W | G | W | W | W | R | W | W |
| G | B | G | W | G | B | G | W |
| W | W | W | R | W | W | W | R |
| G | W | G | B | G | W | G | B |
| W | R | W | W | W | R | W | W |

FIG. 2B

| W | R | W | R |
|---|---|---|---|
| B | W | B | W |
| W | R | W | R |
| B | W | B | W |

| W | R | W | R |
|---|---|---|---|
| B | G | B | G |
| W | R | W | R |
| B | G | B | G |

METHOD OF MANUFACTURING IMAGE SENSOR FOR REDUCING CROSSTALK CHARACTERISTIC

CROSS-REFERENCE TO RELATED APPLICATIONS

This is a continuation application based on pending application Ser. No. 14/814,829 filed Jul. 31, 2015, the entire contents of which is hereby incorporated by reference.

Korean Patent Application No. 10-2014-0099137, filed on Aug. 1, 2014, entitled, "Image Sensor for Reducing Crosstalk Characteristic and Method of Manufacturing the Same," is incorporated by reference herein in its entirety.

BACKGROUND

1. Field

One or more embodiments described herein relate to an image sensor and a method for manufacturing an image sensor.

2. Description of the Related Art

An image sensor converts an optical image into an electrical signal. As the computer and communication industries continue to develop, the demand for image sensors with improved performance increases in various fields, including but not limited to digital cameras, camcorders, personal communication systems, game devices, security cameras, medical micro-cameras, and robotics, An image sensor generally includes a pixel array, where each pixel has a photo diode that performs a photoelectric conversion function. Each pixel may also have a color filter to filter light of a specific wavelength region. In these and other types of image sensors, optical crosstalk may occur, for example, based on a spectral difference between adjacent pixels.

SUMMARY

In accordance with one or more embodiment, an image sensor includes a semiconductor substrate; a plurality of photoelectric detectors; a plurality of color filters spaced from the semiconductor substrate; and at least one pixel isolation region having a predetermined depth, wherein the at least one pixel isolation region is between adjacent ones of the photoelectric detectors, wherein the color filters include a white color filter, and wherein the color filters correspond to respective ones of the photoelectric detectors.

The color filters may include one of a green filter, a red filter, or a blue filter. The at least one pixel isolation region may extend between the semiconductor substrate a layer including the color filters, and the at least one pixel isolation region may contact the semiconductor substrate. The at least one pixel isolation region may include an insulating material. The at least one pixel isolation region may include a bottom at a higher level than a bottom of at least one of the photoelectric detectors.

In accordance with another embodiment, an image sensor includes a semiconductor substrate; at least one pixel isolation region in a trench over the semiconductor substrate; a plurality of photoelectric detectors separated from each other by the at least one pixel isolation region; an anti-reflection layer on the at least one pixel isolation region and the photoelectric detectors; a plurality of color filters on the anti-reflection layer; and a plurality of microlenses on the color filters, wherein the color filters include a white filter.

The at least one pixel isolation region may be between the semiconductor substrate and a layer including the color filters, and the at least one pixel isolation region may contact the semiconductor substrate. The at least one pixel isolation region may include silicon oxide. The at least one pixel isolation region may include an oxide of a high permittivity.

The at least one pixel isolation layer may include an insulating layer surrounding a conductive metal layer. The at least one pixel isolation region may extend in a direction toward the semiconductor substrate, and a bottom of the at least one pixel isolation region may be at a higher level than a bottom of one or more of the photoelectric detectors. A refractive index of the at least one pixel isolation region may be different from a refractive index of one or more of the photoelectric detectors. The color filters may include a green filter, a red filter, or a blue filter. The color filters may correspond to the photoelectric detectors, respectively. The microlenses may correspond to the color filters, respectively.

In accordance with another embodiment, a method of manufacturing an image sensor includes providing a semiconductor substrate; forming a photoelectric detector layer on the semiconductor substrate; forming at least one trench in the photoelectric detector layer to a predetermined depth; filling the at least one trench with an insulating material to form at least one isolation region; forming a color filter layer on the photoelectric detector layer and the at least one isolation region, the color filter layer including a white filter and at least one of a red filter, a green filter, or a blue filter; and forming microlenses on the color filter layer.

Forming the at least one trench may include etching the photoelectric detector layer in a direction of the semiconductor substrate. Forming the at least one trench may include etching the photoelectric detector layer so that a height of the at least one trench is substantially equal to a height of the photoelectric detector layer and so that a surface of the semiconductor substrate is exposed. Forming the at least one trench may include etching the photoelectric detector layer so that a bottom of the at least one trench is higher than a bottom of the photoelectric detector layer. The at least one trench may be between adjacent photoelectric detectors in the photoelectric detector layer. The insulating material may have a refractive index different from a refractive index of the photoelectric detector layer.

The method may include forming an anti-reflection layer before forming the color filter layer. The method may include forming a polysilicon layer inside the at least one trench. The microlenses may correspond to the white filter and at least one of the red filter, the green filter, or the blue filter, respectively. The white filter and at least one of the red filter, green filter, and blue filter may correspond to the photoelectric detectors, respectively.

In accordance with another embodiment, an image sensor includes a first pixel; a second pixel; and an isolation region between the first and second pixels, wherein each of the first and second pixels includes a photodetector and a color filter, the isolation region under the color filter and extending along and optically separating the photodetectors of the first and second pixels. The isolation region may include a first surface to reflect incident light in a direction toward the photodetector of the first pixel and a second surface to reflect incident light in a direction toward the photodetector of the second pixel.

The image sensor may include a first color filter and a second color filter, wherein the first color filter may correspond to the photodetector of the first pixel and the second color filter may correspond to the photodetector of the second pixel, and wherein the first color filter may be a white color filter. The isolation region and the photodetectors of the first and second pixels may have substantially a same height. The isolation region may have a first length, the photodetectors of the first and second pixels may have a second length, and the first length may be less than the second length.

BRIEF DESCRIPTION OF THE DRAWINGS

Features will become apparent to those of skill in the art by describing in detail exemplary embodiments with reference to the attached drawings in which:

FIGS. 2A and 2B illustrate examples of color filter arrays;

DETAILED DESCRIPTION

Figure 1:
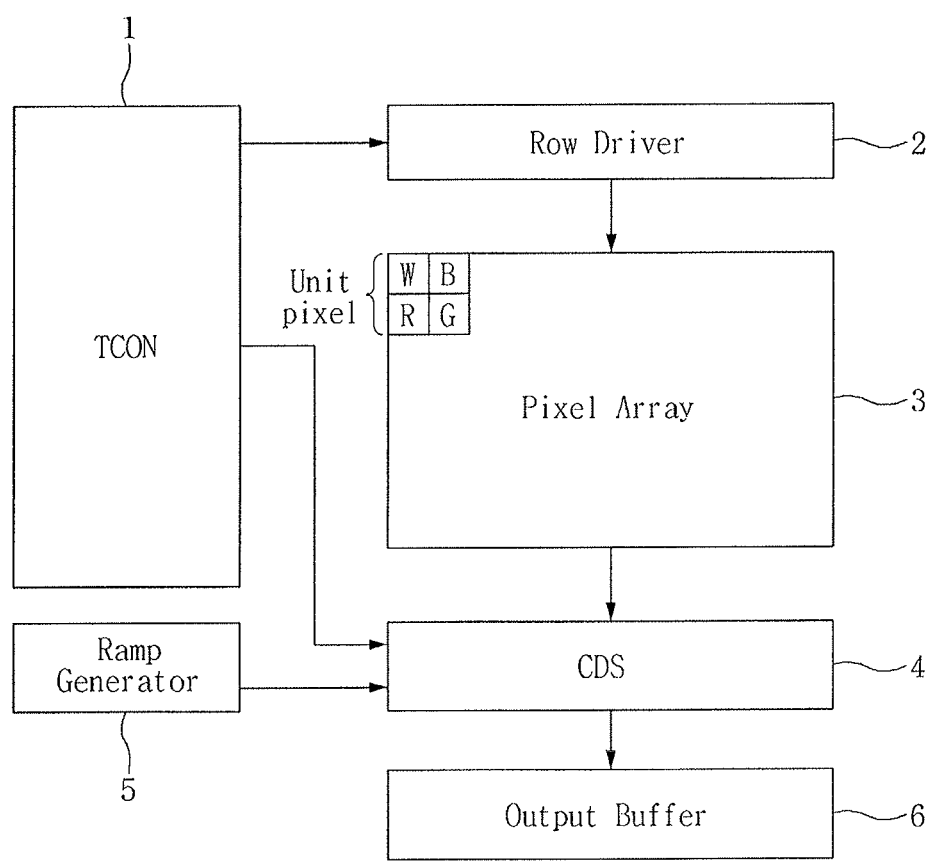
FIG. 1 illustrates one type of image sensor.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, exemplary embodiments will be described in detail with reference to the accompanying drawings. In detailed descriptions of the exemplary embodiments, detailed descriptions of well-known configurations unrelated to the exemplary embodiments will be omitted. In this specification, when reference numerals are assigned to components of each drawing, it should be noted that, although the same components are illustrated in different drawings, the same numerals are assigned as much as possible.

It will be understood that, although the terms "first," "second," etc. may be used herein to describe various elements, these elements should not be limited by these terms. These terms are only used to distinguish one element from another. For example, a first element could be teamed a second element, and similarly, a second element could be termed a first element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion, that is, "between" versus "directly between," "adjacent" versus "directly adjacent," etc.

The terminology used herein is for the purpose of describing particular embodiments only and is not intended to be limiting of claim scope. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which the embodiments belong. It will be further understood that terms in common usage should also be interpreted as is customary in the relevant art and not in an idealized or overly formal sense unless expressly so defined herein.

FIG. 1 illustrates one type of image sensor 10 which includes a timing controller (TCON) 1, a row driver 2, a pixel array 3, a correlated double sampler (CDS) 4, a ramp generator 5, and an output buffer 6.

The TCON 1 generates control signals for driving the pixel array 3 and provides the generated control signals to the row driver 2 and the CDS 4. For example, the TCON 1 may receive image data and various control signals from an external source and control operations of the row driver 2 and the CDS 4.

The row driver 2 provides pixel selection-related signals to control driving of the pixel array 3. The row driver 2 provides a control signal which, for example, may select a row (e.g., a row control signal) for decoding or which is based on a decoded address signal. At least one row of the pixel array 3 may be selected by the row control signal.

The pixel array 3 may include pixels which are connected to a plurality of rows and columns in a matrix form. Each pixel may include, for example, a red pixel for electrically converting the light in a red spectral region, a green pixel for electrically converting the light in a green spectral region, a blue pixel for electrically converting the light in a blue spectral region, or a white pixel capable of electrically converting all spectra in the visible light region. When the pixel array 3 uses a white pixel, the formation of a highly sensitive display is possible.

In one embodiment, a unit pixel may include four color filters, e.g., white, red, blue, and green filters. For example, each of the color filters for transmitting the light in a specific spectral region may be arranged on an upper part of each pixel. Each pixel includes a photo detector. The pixel array 3 may electrically convert an optical signal in response to a control of the TCON 1 and the row driver 2, and the electrically converted signal may be displayed.

The unit pixel may be arranged in a 2×2 array pattern or a different pattern. For example, the unit pixel may include a 4×4 array form, a 6×6 array form, or an array form in which a green pixel is removed. Arrangements such as illustrated in FIGS. 2A and 2B may include various arrangements of filters to increase sensitivity of a display.

FIG. 2A illustrates a color filter array 50 which includes a plurality of color filters R, G, W, and B. In the color filter array 50, the location and arrangement of the color filters may be changed to appropriate locations, while maintaining a basic pattern 60. However, sizes of unit areas in which the color filters R, G, W, and B are implemented are substantially the same.

FIG. 2B illustrates a color filter array 50 that has a 4×4 array, where the white filter W instead of the green filter G may be at an appropriate location or the white filter W may be appropriately at only a necessary location. For example, the color filter array 50 may be configured in various ways depending on the intent of a designer or a required specification of a panel.

The CDS 4 receives an electrical signal formed on the pixel array 3 through a vertical signal line and performs a sampling operation or maintains the electrical signal. The CDS 4 performs double sampling of a specific noise level and a signal level in the generated electrical signal. As a result, a fine voltage is output corresponding to a difference between the noise level and the signal level.

The ramp generator 5 generates a reference voltage (e.g., a ramp voltage) used in the CDS 4 and provides the reference voltage. For example, the ramp generator 5 may be an integrator and may generate a ramp voltage of a waveform having a level that is changed to an inclined level or a stepped level as time passes. The output buffer 6 receives the double-sampled signal from the CDS 4.

Figure 3:
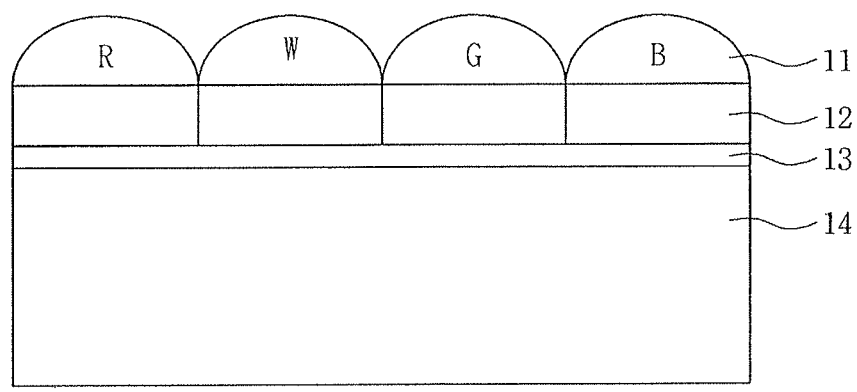
FIG. 3 illustrates an embodiment of a unit pixel.

FIG. 3 illustrates an embodiment of a unit pixel, which, for example, may be included in FIG. 1. Referring FIG. 3, the unit pixel includes a photo-detecting device layer 14, an anti-reflection layer 13, a color filter layer 12, and a microlens layer 11.

The unit pixel may be included in a backside illuminated image sensor, in which incident light is illuminated through a back surface of a semiconductor substrate and is photoelectrically converted so that the pixels have an improved light receiving efficiency and light sensitivity.

First, the photo-detecting device layer 14 may include a material capable of detecting light. For example, formation of the photo-detecting device layer 14 may be performed through an ion implantation process with an N-type impurity. When the photo-detecting device layer 14 is formed, the ion implantation process is performed on a region, which may be a lower part of each filter, with a different doping concentration so as to form a potential barrier.

The anti-reflection layer 13 is formed on the photo-detecting device layer 14. For example, the anti-reflection layer 13 may include a silicon oxide based material. The anti-reflection layer 13 may be or include a layer having an anti-reflection function using, for example, SiON, SiC, SiCN, or SiCO. A caption layer to protect the substrate may be included with or instead of the anti-reflection layer 13.

The color filter layer 12 is formed on the anti-reflection layer 13. The color filter layer 12 has an array structure including, for example, a blue filter, a green filter, a red filter, and a white filter. The color filter layer 12 may be formed, for example, by coating and patterning a material of forming a color filter using an appropriate mask. A dyed photoresist may be mainly used as the material of forming a color filter.

Such a color filter layer 12 includes four filters of red, green, blue, and white. For example, the white filter may be formed by a transparent planarizing layer so that all wavelengths in the visible light region (e.g., in a red region, a green region, and a blue region) are transmitted. Alternatively, the white filter may be formed by a material in which a pigment is removed from a photoresist material, or may not be formed by any material in a region for a white filter by forming an opening. However, since the latter case may cause expansion of regions of adjacent pixels, caution is needed.

The microlens layer 11 may be formed on the color filter layer 12, and may use a photoresist having an excellent light transmission. The microlens layer 11 is arranged and formed at a location corresponding to the color filter layer 12. For example, the microlens layer 11 is formed by coating and patterning a photoresist for a microlens. Then, the microlens layer 11 having a hemispherical dome form may be formed when performing a reflow process using a thermal process. An over-coating layer may be interposed between the color filter layer 12 and the microlens layer 11.

In the process of forming the unit pixel of the image sensor, the photo-detecting device layer 14 is formed, a potential barrier is formed in a region corresponding to a lower part of each filter, and then the filters are distinguished. For example, device isolation between photo diodes may be performed based on a doping profile. However, in the case of a white filter, since a spectral range thereof is relatively wider than those of the other filters and light is incident on an adjacent pixel, a crosstalk phenomenon between the adjacent pixels may occur.

Figure 4:
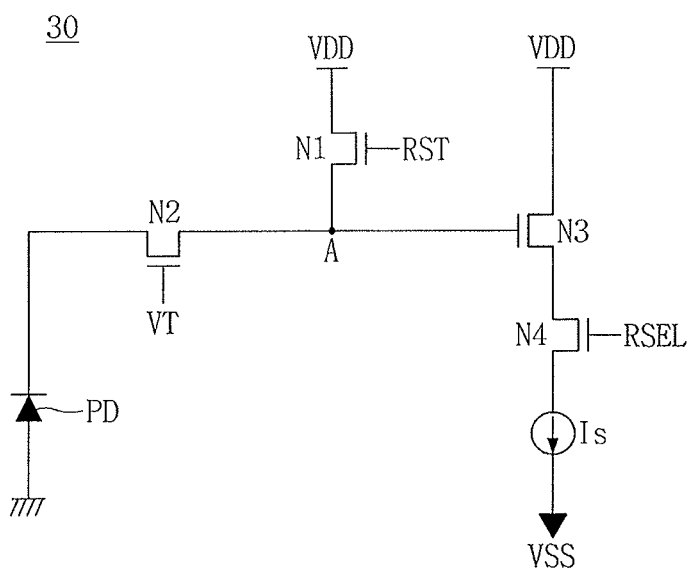
FIG. 4 illustrates a pixel circuit having a 4-transistor (4T) structure.

FIG. 4 illustrates a pixel circuit having a 4-transistor (4T) structure. The pixel includes a photo-detecting device PD and four transistors N1, N2, N3, and N4.

The photo-detecting device PD photoelectrically converts incident light to a number of electrons corresponding to a quantity of the light. The photo-detecting device PD may include at least one of a photo diode, a photo transistor, a photo gate, a pinned photo diode (PPD), or a combination thereof.

A transfer transistor N2 is electrically connected between the photo-detecting device PD and an output node A which is a floating diffusion region. When a drive signal VT is applied, the transfer transistor N2 turns on to transfer the electrons photoelectrically converted from the photo-detecting device PD, which is a photoelectric conversion device, to the output node A.

A reset transistor N1 is electrically connected between a pixel voltage VDD and the output node A. The reset transistor N1 is controlled by a reset signal RST to reset an electric potential of the output node A based on a level of the pixel voltage VDD.

An amplifying transistor N3 is electrically connected to the output node A. The amplifying transistor N3 may be, for example, a source follower with a selection transistor N4.

The selection transistor N4 is controlled by a selection signal RSEL and may be electrically connected, for example, between a correlated double sampling (CDS) circuit and the amplifying transistor N3. When the selection signal RSEL is activated, the selection transistor N4 may be turned on, and the electric potential of the output node A may be amplified and output through the amplifying transistor N3.

An analog voltage output from each pixel in the pixel array is converted into a digital value and processed according to a subsequent operation. For example, an analog-to-digital (A/D) conversion may be performed by two read operations on a row. During a first read operation, the reset level of the pixel is read and then the A/D conversion is performed. A variation may occur for each unit pixel at the reset level. During a second read operation, an actual signal, which is photoelectrically converted, is read from the pixel and then the A/D conversion is performed. In this case, since a variation may also occur for each unit pixel, a CDS may be performed. As described above, a signal is converted to a digital signal and provided as a final output through a subsequent circuit, for example, the output buffer 6 (see FIG. 1).

In one type of image sensor, light passes through a lens to illuminate a photoelectric conversion device formed on a multilayered wiring layer. The photoelectric conversion device detects light which is transmitted between or among the wiring layers. However, the amount of incident light which actually reaches the photoelectric conversion device may not be enough, because a layout which includes the multilayered wiring layer serves as a obstacle that attenuates light transmission to the photoelectric conversion device. For example, since an aperture ratio with respect to the photoelectric conversion device is reduced by the layout having the multilayered wiring layer, the amount of light incident on the photoelectric conversion device is significantly reduced. Therefore, sensitivity may be degraded.

Figure 5:
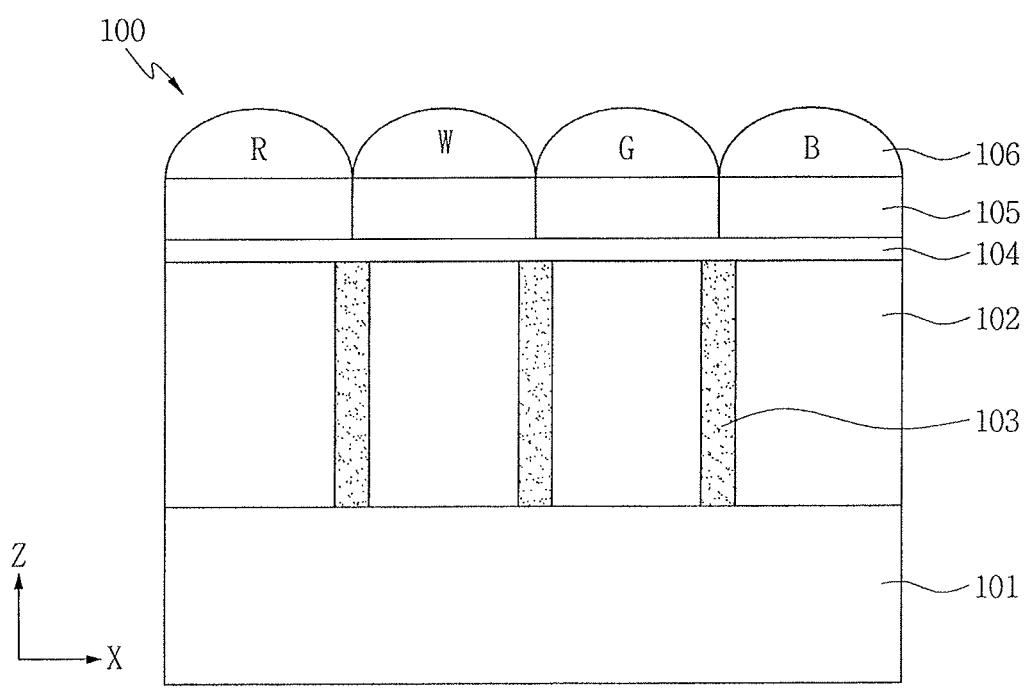
FIG. 5 illustrates an embodiment of a backside-illuminated image sensor.

FIG. 5 illustrates an embodiment of a backside illuminated image sensor (BIS) 100. The BIS 100 formed on the backside of a semiconductor substrate 101. In operation, light illuminates from the backside of the semiconductor substrate 101 (e.g., opposite a wiring unit), and then the photoelectric conversion device receives the light. Thus, an effective aperture ratio may be increased and sensitivity may be significantly improved, without using a layout having a multilayered wiring layer which serves as an obstacle in the aforementioned image sensor.

Referring to FIG. 5, the BIS 100 includes the semiconductor substrate 101, photoelectric detecting devices 102, pixel isolation regions 103, an anti-reflection layer 104, color filters 105, and microlenses 106. In this embodiment, the photoelectric detecting devices 102 are defined (or partitioned) by the pixel isolation regions 103, and are provided under the plurality of color filters 105 including a white filter W, respectively. Thus, an optical crosstalk phenomenon between adjacent pixels may be reduced.

The semiconductor substrate 101 may be, for example, a silicon wafer, a silicon on insulator (SOI) substrate, or a semiconductor epitaxial layer. Although the semiconductor substrate 101 is exemplified for convenience of description, a plurality of transistors (see, e.g., the transfer transistor N2, the reset transistor N1, the amplifying transistor N3, and the selection transistor N4 in FIG. 4) may be provided. Further, the semiconductor substrate 101 may include a metal wiring layer of a conductive material. For example, the semiconductor substrate 101 may be provided as a resultant structure including the described above plurality of transistors and the metal wiring layer.

The photoelectric detecting devices 102 may be provided on the backside of the semiconductor substrate 101 described above. Each of the photoelectric detecting devices 102 may be defined by at least one of the pixel isolation regions 103. The photoelectric detecting device 102 may include, for example, a photo diode, a photo transistor, a photo gate, a PPD, or a combination thereof. In one embodiment, the photoelectric detecting device 102 may correspond to the photo-detecting device PD in FIG. 4.

Each of the pixel isolation regions 103 may be included in a layer formed using a deep trench isolation (DTI) process, so that the photoelectric detecting devices 102 are spaced apart from each other, e.g., along the x and y axes. For example, a trench formed to have a depth which is substantially the same as a height of the photoelectric detecting device(s) 102 is filled (e.g., along the z axis) and, thus, corresponding ones of the pixel isolation regions 103 may be formed. The pixel isolation regions 103 isolate the light that targets corresponding ones of the photoelectric detecting devices 102. Thus, dispersion of the light to adjacent photoelectric detecting devices 102 may be minimized.

Therefore, according to one embodiment, the photoelectric detecting devices 102 corresponding to the pixel regions are physically spaced apart and distinguished from each other by the pixel isolation regions 103. As a result, optical and electrical crosstalk phenomena caused by a spectral difference between the filters of the pixels may be reduced.

The anti-reflection layer 104 may be formed on the pixel isolation layer 103 and the photoelectric detecting devices 102.

The color filters 105 are formed to correspond to the photoelectric detecting devices 102, respectively. The color filters 105 may be, for example, red, white, green, and blue filters. The color filters may correspond to a different combination of colors in another embodiment.

The microlenses 106 may be formed on upper surfaces of the color filters 105, respectively. For example, the microlenses 106 may be arranged and formed on locations corresponding to the color filters 105, respectively.

Figure 6A:
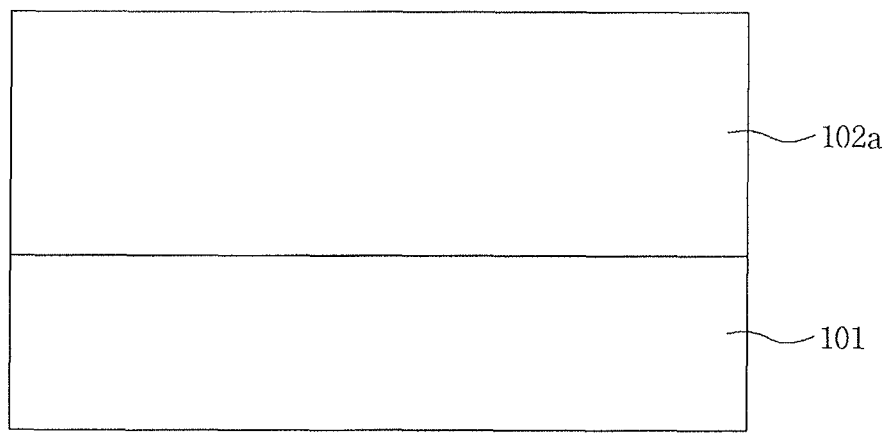
FIGS. 6A to 6E illustrate stages in an embodiment of a method for manufacturing the image sensor in FIG. 5.

FIGS. 6A to 6E are cross-sectional views of stages in an embodiment of a method for manufacturing an image sensor such as illustrated in FIG. 5. Referring to FIG. 6A, a photoelectric detecting device layer 102a may be formed on a semiconductor substrate 101 including a front side. In one embodiment, after the front side of the semiconductor substrate 101 is completed, the photoelectric detecting device layer 102a may be formed, for example, by implanting N-type impurity ions onto a backside of the semiconductor substrate 101. Alternatively, the photoelectric detecting device layer 102a may be formed by implanting a plurality of P-type and N-type ions. The photoelectric detecting device layer 102a is therefore formed of a material that receives and detects light.

Figure 6B:
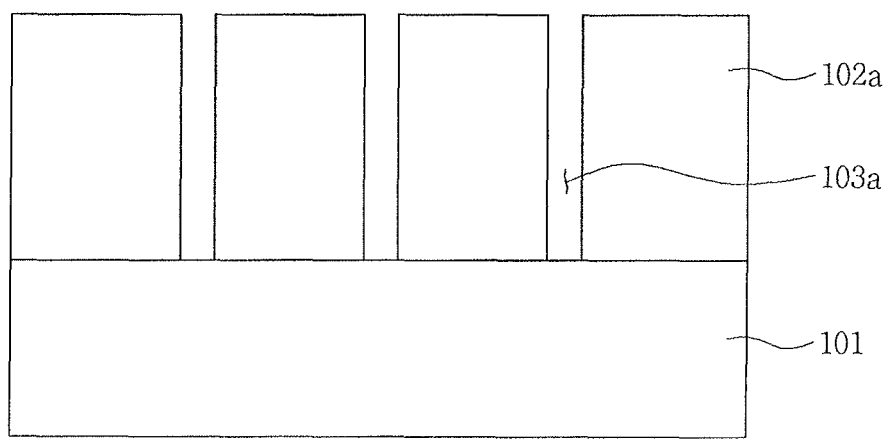

Referring to FIG. 6B, a predetermined number of deep trenches 103a are formed in the photoelectric detecting device layer 102a. For example, predetermined regions of the photoelectric detecting device layer 102a are etched, and then the deep trenches 103a that expose an upper surface of the semiconductor substrate 101 are formed.

The distance between the deep trenches 103a may be determined within a predetermined range. The predetermined range may be one in which sufficient light may be incident through color filters 105 (see FIG. 5) and photoelectric detecting devices 102 (see FIG. 5). Further, the depth of the deep trench 103a may be substantially the same as a height of the photoelectric detecting device layer 102a. For example, the depth may be 1 μm or more. In one embodiment, the depth of the deep trench 103a may be in a range of 2 to 3 μm depending, for example, on the product.

Figure 6C:
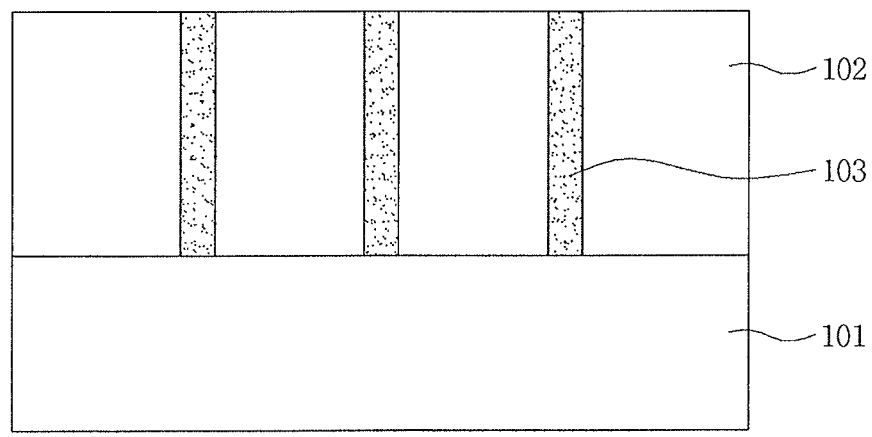

Referring to FIG. 6C, the deep trenches 103a (see FIG. 6B) are filled with insulating material and then pixel isolation regions 103 are formed. Thus, the photoelectric detecting devices 102 may be separated from each other. Further, each of the completed photoelectric detecting devices 102 may receive and detect light of a predetermined spectrum.

The insulating material may be, for example, an insulating material having a different refractive index from the photoelectric detecting device 102. In one embodiment, the insulating material that forms an inside of the pixel isolation regions 103 may include silicon oxide.

The pixel isolation region 103 not only may physically separate the photoelectric detecting devices 102, but also may reflect light, so that light incident on each corresponding pixel is not incident on an adjacent pixel. Because regions of the pixels are separated and spaced by the pixel isolation regions 103, the optical crosstalk phenomenon may be reduced. The pixel isolation regions 103 may also be referred to as light barrier regions, in terms of suppressing the crosstalk phenomenon by reflecting the incident light.

Figure 6D:
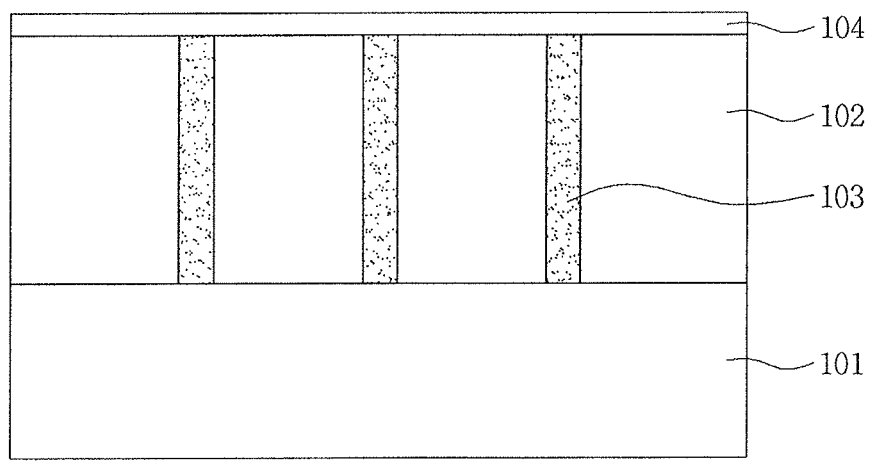

Referring to FIG. 6D, an anti-reflection layer 104 is formed on the resultant structure illustrated in FIG. 6C. The anti-reflection layer 104 may include a material performing an anti-reflection function. For example, the anti-reflection layer 104 may include a silicon based material, e.g., SiON, SiC, SiCN, or SiCO. In FIG. 6D, the anti-reflection layer 104 is illustrated as a single layer.

In another embodiment, the anti-reflection layer 104 includes multiple layers in which materials having different refractive indexes are stacked. For example, the anti-reflection layer 104 may be formed as a stacked layer (e.g., an oxide layer/a nitride layer or a nitride layer/an oxide layer) in which the oxide layer and the nitride layer are stacked. In another embodiment, the anti-reflection layer 104 may be formed from a stacked layer including at least one carbon-based layer, e.g., an oxide layer/SiC layer or an SiC layer/an oxide layer.

The oxide layer may include, for example, a borophosphosilicate glass (BPSG) layer, a phosphosilicate glass (PSG) layer, a borosilicate glass (BSG) layer, an un-doped silicate glass (USG) layer, a tetra ethyl ortho silicate (TEOS) layer, or a high density plasma (HDP) layer. The nitride layer may include, for example, a silicon nitride layer ($Si_xN_y$, where x and y are natural numbers) or a silicon oxynitride layer ($Si_xO_yN_z$, where x, y, and z are natural numbers).

Figure 6E:
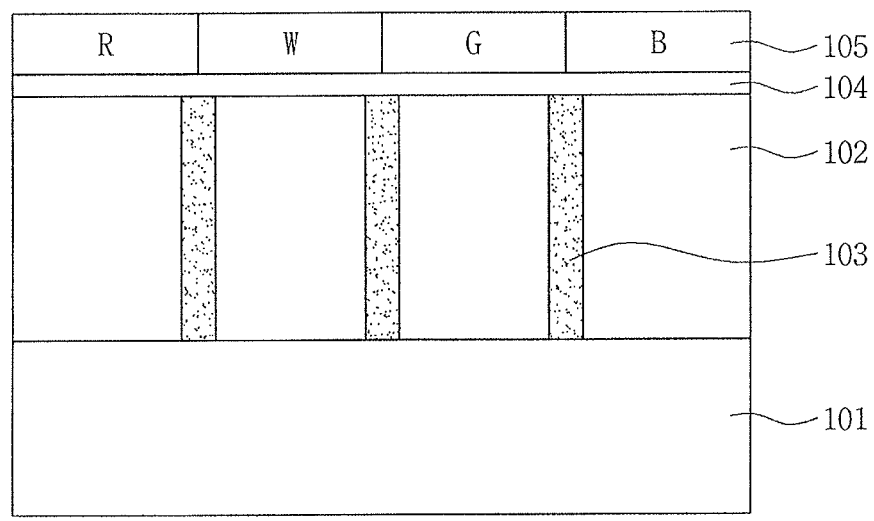

Referring to FIG. 6E, the color filters 105 are formed on the resultant structure shown in FIG. 6D. The color filters 105 include a plurality of filters. The plurality of filters may include, for example, a red filter R, a white filter W, a green filet G, and a blue filter B. The white filter W may be included in the color filters 105, for example, to increase sensitivity of image quality during display.

When the red filter R is referred to as a filter of a first type, the filter of the first type may be replaced by a cyan filter, a yellow filter, or a magenta filter.

When the green filter G is referred to as a filter of a second type, the filter of the second type may be replaced by a cyan filter, a yellow filter, or a magenta filter.

When the blue filter B is referred to as a filter of a third type, the filter of the third type may be replaced by a cyan filter, a yellow filter, or a magenta filter.

When the white filter W is referred to as a filter of a fourth type, the filter of the fourth type may be implemented by a transparent filter or a filter that may block infrared light. Although the white filter W is formed by the transparent filter to transmit all of the light in the visible light region, the white filter may be different constructed in other embodiments. In one embodiment, the white filter may transmit a predetermined number of light colors less than all light colors.

Referring again to FIG. 5, the microlenses 106 are formed on the color filters 105. The microlens 106 may use a photo resist having excellent light transmission. The microlenses 106 are arranged and formed at locations corresponding to respective ones of the color filters 105. For example, material of the microlens 106 is coated with a photo resist and then patterned. Then, the microlens 106 having a hemispherical dome form may be formed when performing a reflow process using a thermal process.

The microlens 106 may be formed on the backside of the semiconductor substrate 101. Thus, a BIS may be formed in which light illuminates the backside of the semiconductor substrate 101 and the light is incident on the photoelectric detecting device 102 serving as a light receiving part. The BIS may serve to reduce occurrence of the optical crosstalk phenomenon between adjacent pixels. The pixel isolation regions 103 may be formed using another method than described above.

Figure 7:
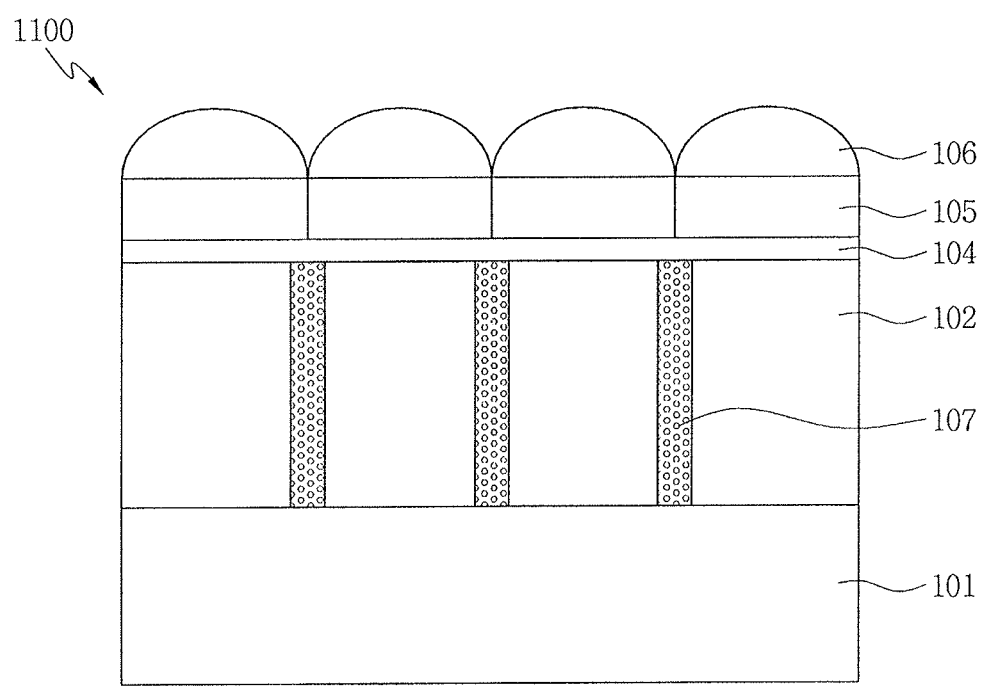
FIG. 7 illustrates another embodiment of an image sensor.

FIG. 7 illustrates another embodiment of an image sensor 1100 including pixel isolation regions 107. Referring to FIG. 7, the structure and function of the image sensor 1100 may be similar to those of the image sensor 100 in FIG. 5, but the process for forming the pixel isolation regions may be different.

In accordance with this embodiment, the image sensor 1100 includes the semiconductor substrate 101, photoelectric detecting devices 102, pixel isolation regions 107, anti-reflection layer 104, color filters 105, and microlenses 106.

The pixel isolation regions 107 may be formed by a DTI process, so that the photoelectric detecting devices 102 are spaced apart from each other. In this case, the pixel isolation regions 107 may be formed by filling a trench to a depth which is substantially the same as a height of the photoelectric detecting device 102. The pixel isolation regions 107 may be formed, for example, of a material having a permittivity greater than that of silicon oxide (e.g., high-k) and a refractive index less than the silicon oxide, e.g., hafnium oxide (HfO).

As a result, insulating characteristics of the pixel isolation regions 107 is improved, and a difference between refractive indexes of the pixel isolation regions 107 and the photoelectric detecting device 102 is increased. Thus, a total reflection condition is improved. Further, the process of forming the deep trench becomes easier, and thus formation of the pixel isolation regions 107 becomes simpler.

Figure 8:
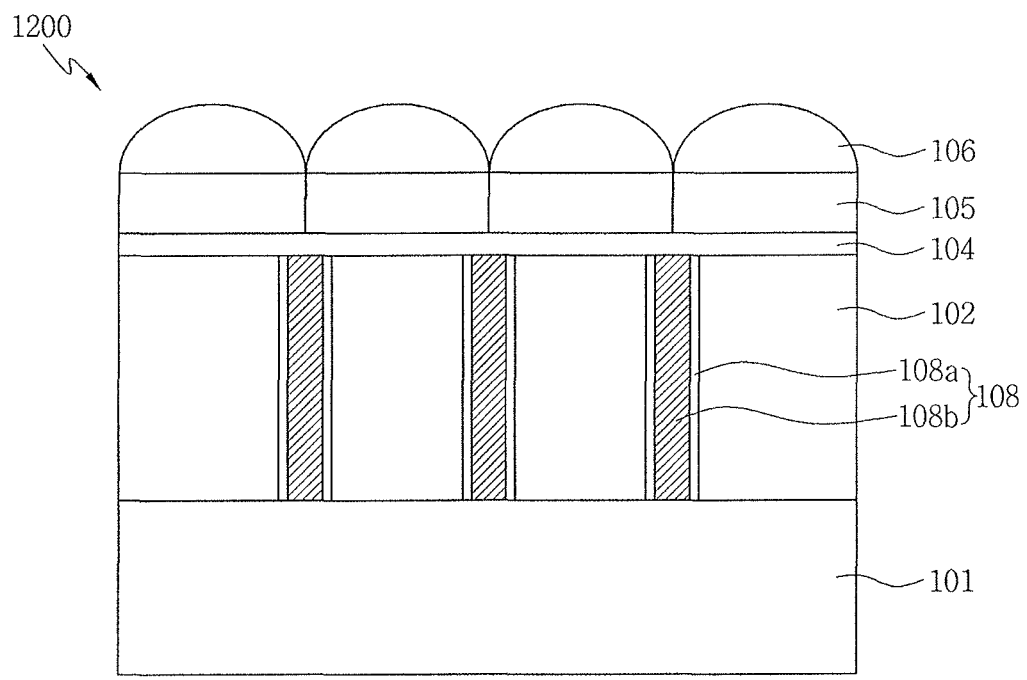
FIG. 8 illustrates another embodiment of an image sensor.

FIG. 8 illustrates another embodiment of an image sensor 1200 including pixel isolation regions 108. Referring to FIG. 8, a structure and a function of the image sensor 1200 may be similar to the image sensors 100 and 1100 in FIGS. 5 and 7, but a process for forming the pixel isolation regions is different.

The pixel isolation regions 108 may be formed by a DTI process, so that the photoelectric detecting devices 102 are spaced apart from each other. In this case, the pixel isolation regions 108 may be formed from a material filling a trench having a depth which is substantially the same as a height of the photoelectric detecting device 102.

The pixel isolation regions 108 may include an insulating layer 108a and a polysilicon layer 108b interposed inside the insulating layer 108a. For example, a deep trench may be formed having a side wall (e.g., insulating layer 108a) with an oxide of approximately 50 Å thickness. The inside of the deep trench may be filled with the polysilicon layer 108b, and then the pixel isolation regions 108 may be formed from the polysilicon layer 108b. For example, the pixel isolation regions 108 may be formed by the interposition of the polysilicon layer 108b, which is a conductive layer surrounded with the insulating layer 108a. Thus, refractive index may be improved and interference between the pixels may also be reduced.

Figure 9:
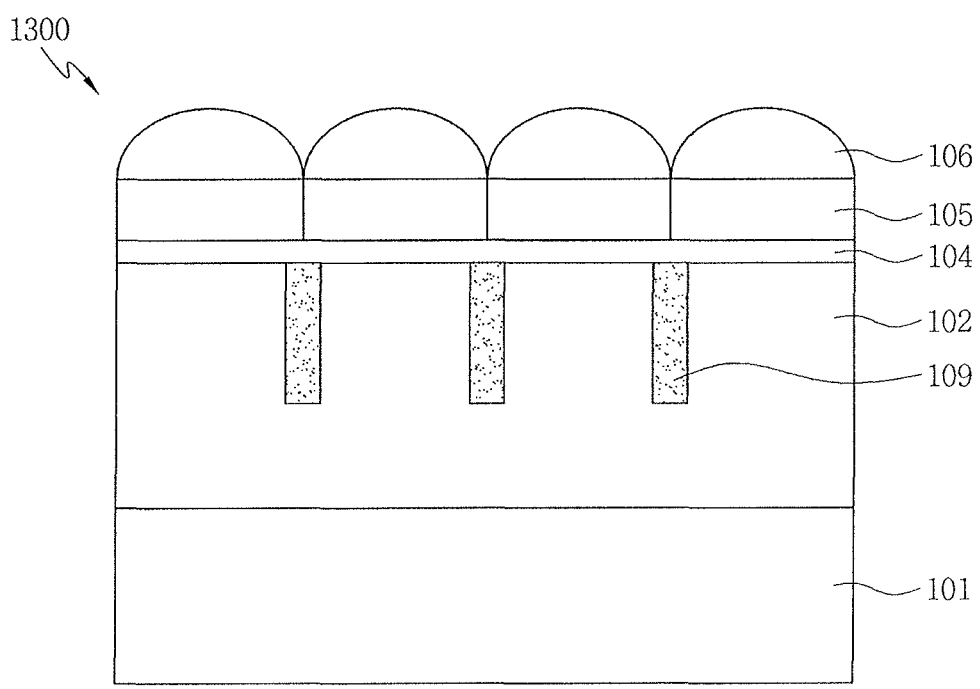
FIG. 9 illustrates another embodiment of an image sensor.

FIG. 9 illustrates another embodiment of an image sensor 1300 having a structure and a function similar to the image sensor 100 in FIG. 5, but a process for forming pixel isolation regions is different.

The image sensor 1300 includes the semiconductor substrate 101, photoelectric detecting devices 102, pixel isolation regions 109, anti-reflection layer 104, color filters 105, and microlenses 106.

The pixel isolation regions 109 may be formed by a trench isolation process, so that the photoelectric detecting devices 102 are spaced apart from each other in a predetermined region. In this case, the pixel isolation regions 109 may be formed to have a depth less than a height of the photoelectric detecting devices 102. For example, the pixel isolation regions 109 may extend in a direction of the semiconductor substrate 101 from the color filter 105 by a predetermined depth, and then may be formed to have a bottom at a higher level than the photoelectric detecting devices 102.

For example, a trench having the predetermined depth may be formed in the photoelectric detecting device layer 102a (see FIG. 6A), an insulating material may fill an inside of the trench, and then the pixel isolation regions 109 may be formed.

According to another embodiment, the photoelectric detecting devices 102 may be etched to have an appropriate depth, so that light is appropriately incident thereon and is reflected. Thus, in this embodiment, the photoelectric detecting devices 102 are not completely isolated. As a result, etching stress with respect to the semiconductor substrate 101 may be reduced.

At the same time, since the pixel isolation regions 109 separate the photoelectric detecting devices 102 in a predetermined region (e.g., a region adjacent to light receiving related devices (e.g., the microlens and the color filter)) and physically block the light, optical crosstalk between the adjacent photoelectric detecting devices 102 may be reduced.

In the aforementioned embodiments, the photoelectric detecting devices 102 corresponding to respective ones of the pixel regions are physically spaced apart and distinguished from each other by the pixel isolation regions 103, 107, 108, or 109. Thus, the optical and electrical crosstalk phenomenon due to a spectral difference between the filters of the pixels may be reduced.

These or other embodiments may be applied to pixel circuits of various structures different from a 4T structure.

Figure 10:
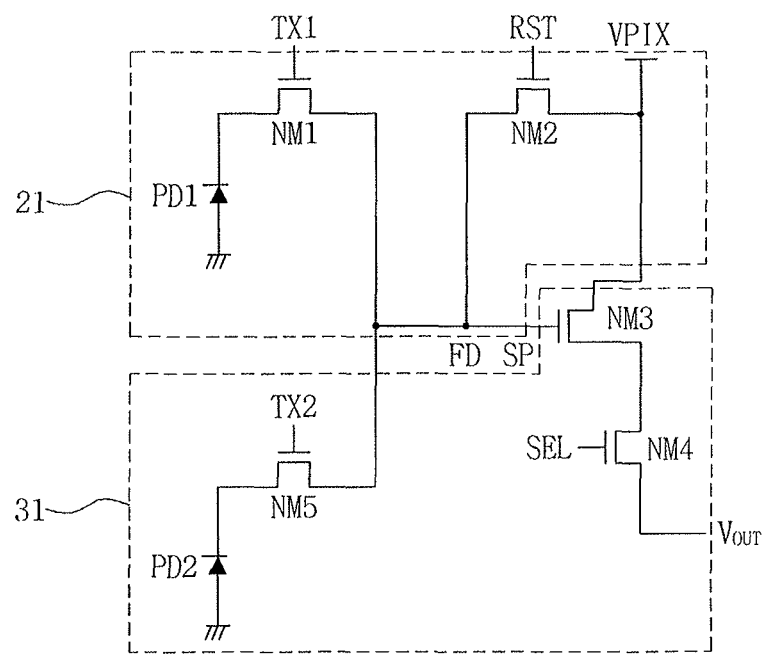
FIG. 10 illustrates an embodiment of a pixel circuit with a 4T-2 shared structure.

FIG. 10 illustrates an embodiment of a pixel circuit having a 4T-2 shared pixel structure including pixels 21 and 31. Each of the pixels 21 and 31 includes a photo diode and a transfer transistor coupled to the photo diode. The remaining transistors in the pixels 21 and 31 are arranged in a shared structure.

Referring to FIG. 10, the first pixel 21 includes a first photo diode PD1, a first transfer transistor NM1, and a reset transistor NM2. The second pixel 31 includes a second photo diode PD2, a second transfer transistor NM5, a source follower transistor NM3, and a selection transistor NM4.

In this structure, the first transfer transistor NM1 is connected to the first photo diode PD1 and controlled by a first drive signal TX1. The reset transistor NM2 is between a floating diffusion region FD and a pixel voltage VPIX, and controlled by a reset signal RST. The second transfer transistor NM5 is connected to the second photo diode PD2 and controlled by a second drive signal TX2. The source follower transistor NM3 is controlled by the floating diffusion region FD and constitutes a source follower with the selection transistor NM4. The selection transistor NM4 is controlled by a selection signal SEL and is electrically connected to the source follower transistor NM3 to supply an output voltage $V_{OUT}$.

The pixels 21 and 31 are vertically arranged and may share the floating diffusion region FD. Although the pixels are connected to different rows in this embodiment, signals photoelectrically converted from the photo diodes PD1 and PD2 may be transferred using the transfer transistors NM1 and NM5, respectively. The selection transistor NM4, the source follower transistor NM3, and the reset transistor NM2 may be shared and controlled by a common signal. Since the number of the transistors of the pixel is decreased, the size of the pixel structure may be reduced.

Figure 11:
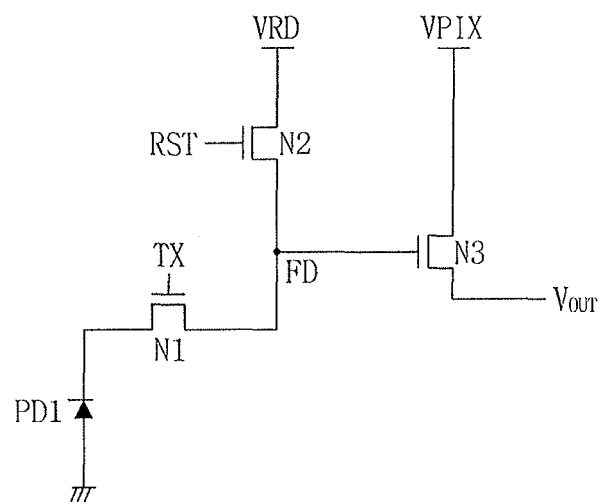
FIG. 11 illustrates an embodiment of a pixel circuit with a 3-transistor structure.

FIG. 11 illustrates an embodiment of a pixel circuit having a 3-transistor (3T) pixel structure. This pixel circuit excludes a selection transistor N4 (compare to FIG. 4). In this embodiment, the selection transistor N4 is replaced by controlling a reset transistor N2 as a read voltage VRD.

Referring to FIG. 11, the pixel circuit having the 3T structure includes a photo diode PD1, a transfer transistor N1, a reset transistor N2, and a source follower transistor N3. The photo diode PD1 is electrically connected to the transfer transistor N1. The transfer transistor N1 is controlled by a drive signal TX, and transfers a signal, which is photoelectrically converted from the photo diode PD1, to a floating diffusion region FD.

The reset transistor N2 is electrically connected to the floating diffusion region FD, and controlled by a reset signal RST. For example, the read voltage VRD of the reset transistor N2 is controlled by a row to serve as a selection transistor when needed. The source follower transistor N3 amplifies an electric charge of the floating diffusion region FD, and provides the amplified electric charge as an output voltage $V_{OUT}$.

In the aforementioned embodiments of pixel circuits, the optical crosstalk phenomenon between the pixels may be reduced.

Figure 12A:
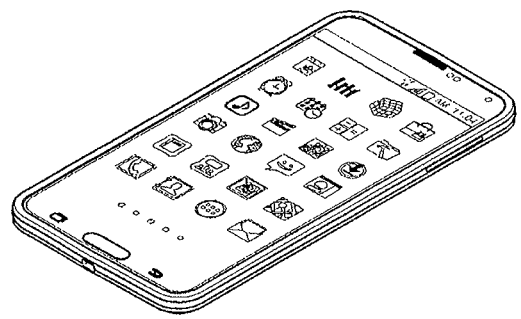
FIGS. 12A to 12C illustrate embodiments of multimedia devices.
Figure 12B:
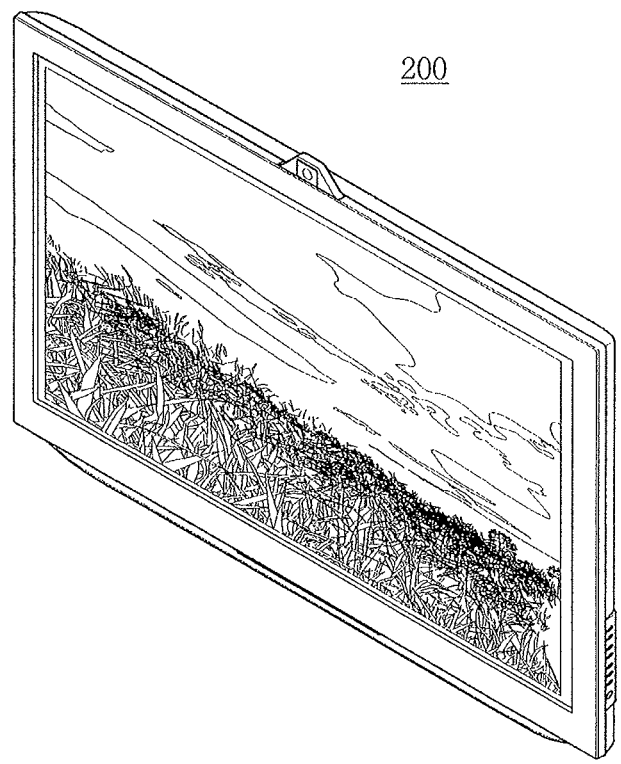
Figure 12C:
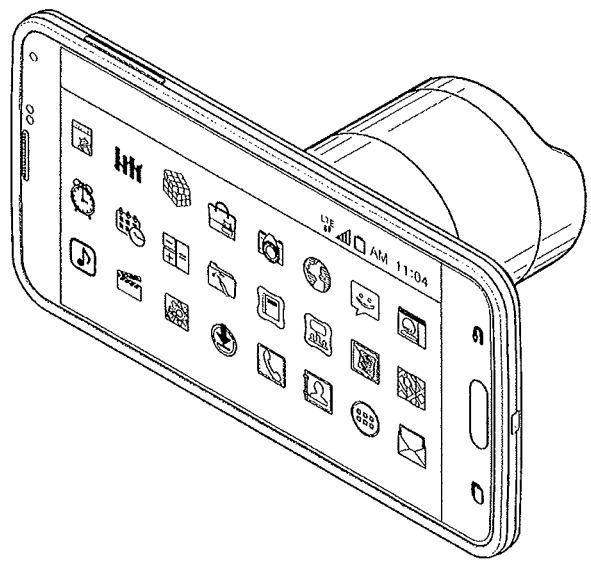

FIGS. 12A to 12C illustrate embodiments of multimedia devices which may include image sensors in accordance with any of the aforementioned embodiments. FIG. 12A illustrates a smart phone 150, and FIG. 12B illustrates a smart TV 200. A high-resolution image sensor in accordance with one or more of the aforementioned embodiments is mounted may mounted in the smart phone and a smart TV. An embodiment of a tablet PC may also include one or more of the aforementioned embodiments of the image sensor.

FIG. 12C illustrates a digital camera 300 including one or more embodiments of the image sensor. Referring to FIG. 12C, the digital camera 300 may include an image sensor for capturing an image or a moving picture, and a display device for displaying an image or a moving picture to be captured.

Figure 13:
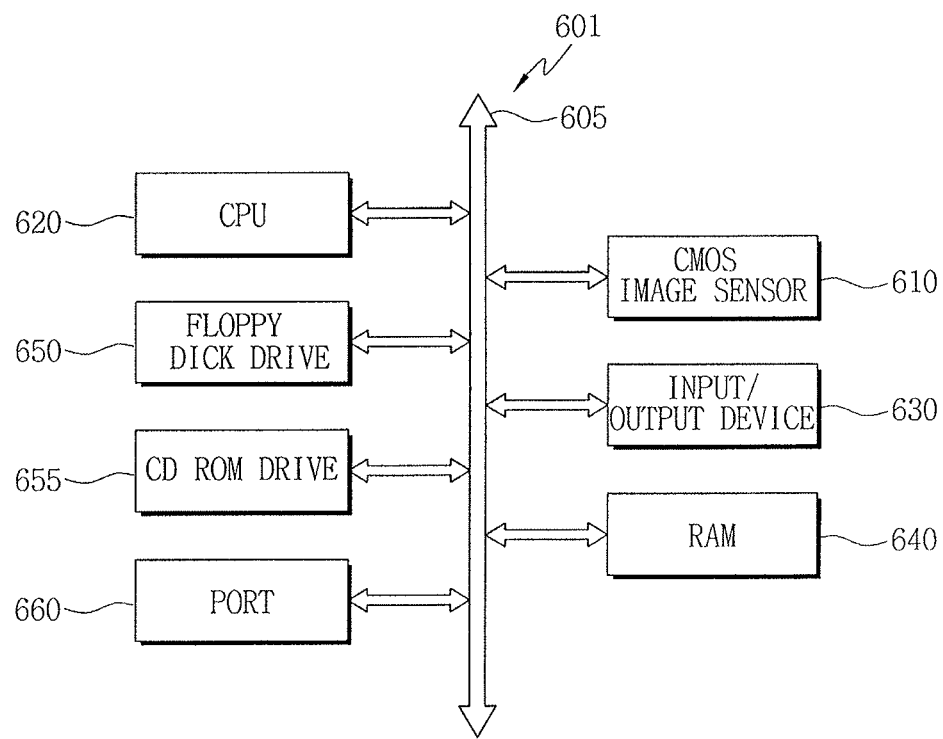
FIG. 13 illustrates an embodiment of a processor-based system.

FIG. 13 illustrates an embodiment of an processor-based system 601 including an image sensor according to one or more of the aforementioned embodiments. Referring to FIG. 13, the processor-based system 601 is a system in which output images of a complementary metal-oxide-semiconductor (CMOS) image sensor 610 are processed. The processor-based system 601 may be, for example, a computer system, a camera, a scanner, a mechanized clock, a navigator, a video phone, a supervision system, an auto focusing system, a tracing system, a motion monitoring system, or an image stabilization system, as well as other types of electronic devices or systems.

The processor-based system 601 (e.g., a computer system) may include a central processing unit (CPU) 620 such as a microprocessor for communicating with an input/output device 630 through a bus 605. The CMOS image sensor 610 may communicate with the processor-based system 601 through the bus 605 or another communication link.

The processor-based system 601 may further include a RAM 640, a floppy disk drive 650 and/or a CD ROM drive 655, and a port 660, which can communicate with the CPU 620 through the bus 605. The port 660 may be a port in which a video card, a sound card, a memory card, a USB device, and the like are coupled, or data is exchanged with other systems. The CMOS image sensor 610 may be integrated with a CPU, a digital signal processing (DSP) device, a microprocessor, and the like, and may be further integrated with a memory. The CMOS image sensor 610 may also be integrated on a chip separated from a processor in some cases.

In accordance with one or more of the aforementioned embodiments, an insulating layer is interposed between photoelectric detecting devices of an image sensor, so that the photoelectric detecting devices (e.g., photo detectors) are physically separated from each other. As a result, optical crosstalk in the image sensor be reduced and high-resolution images may be provided. Additionally, a mobile device, and more specifically, an image sensor and a memory system including the same, may include such an image sensor.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of manufacturing an image sensor, comprising:
   providing a semiconductor substrate;
   forming a photoelectric detector layer on the semiconductor substrate;
   forming at least one trench in the photoelectric detector layer to a predetermined depth;
   filling the at least one trench with an insulating material to form at least one isolation region;
   forming a color filter layer on the photoelectric detector layer and the at least one isolation region, the color filter layer including a white filter and at least one of a red filter, a green filter, or a blue filter; and
   forming microlenses on the color filter layer.

2. The method as claimed in claim 1, wherein forming the at least one trench includes etching the photoelectric detector layer in a direction of the semiconductor substrate.

3. The method as claimed in claim 2, wherein forming the at least one trench includes etching the photoelectric detector layer so that a height of the at least one trench is substantially equal to a height of the photoelectric detector layer and so that a surface of the semiconductor substrate is exposed.

4. The method as claimed in claim 2, wherein forming the at least one trench includes etching the photoelectric detector layer so that a bottom of the at least one trench is higher than a bottom of the photoelectric detector layer.

5. The method as claimed in claim 1, wherein the at least one trench is between adjacent photoelectric detectors in the photoelectric detector layer.

6. The method as claimed in claim 5, wherein the white filter and at least one of the red filter, green filter, and blue filter correspond to the photoelectric detectors, respectively.

7. The method as claimed in claim 1, further comprising:
   forming an anti-reflection layer before forming the color filter layer.

8. The method as claimed in claim 1, wherein the insulating material has a refractive index different from a refractive index of the photoelectric detector layer.

9. The method as claimed in claim 8, further comprising:
   forming a polysilicon layer inside the at least one trench.

10. The method as claimed in claim 1, wherein the microlenses correspond to the white filter and at least one of the red filter, green filter, or blue filter, respectively.

* * * * *